(12) United States Patent
Oh et al.

(10) Patent No.: US 7,992,066 B2
(45) Date of Patent: Aug. 2, 2011

(54) METHOD OF ENCODING AND DECODING USING LOW DENSITY PARITY CHECK MATRIX

(75) Inventors: Min Seok Oh, Seoul (KR); Kyu Hyuk Chung, Seoul (KR)

(73) Assignee: LG Electronics Inc., Seoul (KR)

( * ) Notice: Subject to any disclaimer, the term of this patent is extended or adjusted under 35 U.S.C. 154(b) by 555 days.

(21) Appl. No.: 11/573,539

(22) PCT Filed: Aug. 3, 2005

(86) PCT No.: PCT/KR2005/002527
§ 371 (c)(1),
(2), (4) Date: Oct. 28, 2008

(87) PCT Pub. No.: WO2006/016751
PCT Pub. Date: Feb. 16, 2006

(65) Prior Publication Data
US 2009/0164863 A1 Jun. 25, 2009

(30) Foreign Application Priority Data

Aug. 9, 2004 (KR) .................. 10-2004-0062575
Aug. 13, 2004 (KR) .................. 10-2004-0063806

(51) Int. Cl.
*H03M 13/00* (2006.01)
(52) U.S. Cl. ....................................... 714/752
(58) Field of Classification Search .................. 714/752
See application file for complete search history.

(56) References Cited

U.S. PATENT DOCUMENTS

| 7,089,479 | B2 * | 8/2006 | Matsumoto | 714/758 |
| 2002/0188906 | A1 * | 12/2002 | Kurtas et al. | 714/755 |
| 2004/0093549 | A1 | 5/2004 | Song et al. | |
| 2004/0199859 | A1 | 10/2004 | Matsumoto | |
| 2004/0221223 | A1 * | 11/2004 | Yu et al. | 714/800 |

FOREIGN PATENT DOCUMENTS

| EP | 1460766 A1 | 9/2004 |
| WO | 2005/114418 | 12/2005 |

OTHER PUBLICATIONS

Classon, B., et al., "Modified LDPC Matrix Providing Improved Performance," IEEE 802.16 Broadband Wireless Access Working Group, Doc. IEEE C802.16e-04/101r1, May 15, 2004.

* cited by examiner

*Primary Examiner* — Scott T Baderman
*Assistant Examiner* — Enam Ahmed
(74) *Attorney, Agent, or Firm* — Lee, Hong, Degerman, Kang & Waimey

(57) ABSTRACT

A method of encoding and decoding using an LDPC code is disclosed, by which encoding and decoding performance can be enhanced and which can be effectively applied to a communication system employing a variable data rate. In encoding or decoding an input data using a parity check matrix H, the present invention is characterized in that the parity check matrix H has a configuration of $H=[H_d | H_p]$ (H is (n−k)×n dimensional, k is a bit number of the input data, and n is a bit number of a codeword), wherein the parity check matrix H includes a first part having a column weight of wc and a second part having a column weight of $W_c+W_a$ ($W_a/W_c \neq 0$).

8 Claims, 13 Drawing Sheets

FIG. 2

$$H = \begin{pmatrix} 1 & 0 & 0 & 1 & | & 1 & 0 & 0 & 0 \\ 0 & 1 & 1 & 0 & | & 1 & 1 & 0 & 0 \\ 1 & 0 & 1 & 0 & | & 0 & 1 & 1 & 0 \\ 0 & 0 & 0 & 1 & | & 0 & 0 & 1 & 1 \end{pmatrix}$$

$$\underbrace{\phantom{xxxxxxxx}}_{H_d} \quad \underbrace{\phantom{xxxxxxxx}}_{H_p}$$

FIG. 3

| (1, 1) Sub-matrix | (1, 2) Sub-matrix | (1, 3) Sub-matrix | (1, 4) Sub-matrix |
|---|---|---|---|
| (2, 1) Sub-matrix | (2, 2) Sub-matrix | (2, 3) Sub-matrix | (2, 4) Sub-matrix |

METHOD OF ENCODING AND DECODING USING LOW DENSITY PARITY CHECK MATRIX

CROSS-REFERENCE TO RELATED APPLICATIONS

This application is a PCT filing of International Application No. PCT/KR2005/002527, filed on Aug. 3, 2005, which claims the benefit of earlier filing date and right of priority to Korean Application Nos. 10-2004-0062575, filed on Aug. 9, 2004 and 10-2004-0063806, filed Aug. 13, 2004, the contents of all of which are incorporated by reference herein in their entirety.

TECHNICAL FIELD

The present invention relates to a method of encoding and decoding, and more particularly, to a method of encoding and decoding using a low density parity check (hereinafter abbreviated LDPC) code. Although the present invention is suitable for a wide scope of applications, it is particularly suitable for enhancing performance of the encoding method using the LDPC code and for application to a communication system employing a variable data rate.

BACKGROUND ART

Generally, encoding is a process that a transmitting side performs a data processing for a receiving side to restore original data despite errors caused by signal distortion, signal loss and the like while the transmitting side transmits data via a communication channel. And, decoding is a process that the receiving side restores the encoded transmitted data into the original data.

Recently, many attentions are paid to an encoding method using an LPDC code. The LDPC code is a linear block code having low density since most of elements of a parity check matrix H are zeros, which was proposed by Gallager in 1962. It was difficult to implement the LDPC code that is very complicated due to the technological difficulty in those days. Yet, the LDPC code was taken into re-consideration in 1995 so that its superior performance has been verified. So, many efforts are made to research and develop the LPDC code. (Reference: [1] Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999))

A parity check matrix of the LDPC code is a binary matrix including '0' and '1'. Since the number of '1' of the parity check matrix of the LDPC code is very small, decoding of the parity check matrix of the LDPC is enabled through repetition decoding in case of a large matrix size. If the matrix size is very large, the parity check matrix of the LDPC code shows performance approximating a channel capacity limit of Shannon like a turbo code.

The LDPC code can be explained by a parity check matrix H of $(n-k) \times n$ dimensions. And, a generator matrix G corresponding to the parity check matrix H can be found by Equation 1.

$$H \cdot G = 0 \qquad \text{[Equation 1]}$$

In an encoding/decoding method using an LDPC code, a transmitting side encodes input data by Equation 2 using the generator matrix G having a relation of Equation 1 with the parity check matrix H.

$$c = G \cdot u, \text{ where '}c\text{' is a codeword and '}u\text{' is a data frame.} \qquad \text{[Equation 2]}$$

Yet, an input data encoding method using the parity check matrix H instead of using the generator matrix G is generally used nowadays. Hence, as explained in the above explanation, the parity check matrix H is the most important factor in the encoding/decoding method using the LDPC code. Since the parity check matrix H has a huge size, many operations are required for the corresponding encoding and decoding processes. And, implementation of the parity check matrix H is very complicated. Moreover, the parity check matrix H needs a large storage space.

In adding many weights to the parity check matrix H of the binary matrix including '0' and '1' (i.e., increasing the number of '1'), more variables are added to parity check equations. Hence, better performance can be shown in the encoding and decoding method using the LDPC code.

However, if more weights are added to the parity check matrix H, a 4-cycle or 6-cycle can be generated from the entire parity check matrix. Hence, the performance of the encoding and decoding method using the LDPC code may be degraded.

Moreover, a mobile communication system, wireless Internet system or the like frequently employs a variable data rate according to a channel status or a data volume to be transmitted. Yet, the related art encoding method using the LDPC has difficulty in being applied to the system employing the variable data rate.

DISCLOSURE OF THE INVENTION

Accordingly, the present invention is directed to a method of encoding and decoding method using a low density parity check (LDPC) code that substantially obviates one or more problems due to limitations and disadvantages of the related art.

An object of the present invention is to provide a method of encoding and decoding using an LDPC code, by which encoding and decoding performance can be enhanced.

Another object of the present invention is to provide a method of encoding and decoding using an LDPC code, which can be effectively applied to a communication system employing a variable data rate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in encoding or decoding an input data using a parity check matrix H, a method of encoding or decoding using an LDPC (low density parity check) code according to the present invention is characterized in that the parity check matrix H has a configuration of $H=[H_d|H_p]$ ($H_d$ is $(n-k) \times k$ dimensional, $H_p$ is $(n-k) \times (n-k)$ dimensional, k is a bit number of the input, data, and n is a bit number of a codeword), wherein the $H_d$ includes a first part having a column weight of $w_c$ and a second part having a column weight of $w_c+w_a$ ($w_a$, $w_c \neq 0$).

To further achieve these and other advantages and in accordance with the purpose of the present invention, in encoding or decoding an input data using a parity check matrix H, a method of encoding or decoding using an LDPC (low density parity check) code is characterized in that the parity check matrix H has a configuration of $H=[H_d|H_p]$ (H is (n−k)×n dimensional, k is a bit number of the input data, and n is a bit number of a codeword), wherein the parity check matrix H includes a first part having a column weight of $w_c$ and a second part having a column weight of $w_c+w_a$ ($w_a$, $w_c \neq 0$).

Preferably, if the parity check matrix H comprises a plurality of second sub-matrices having (n−k)×(n−k)/m dimensions, the second part having the column weight of $w_c+w_a$ is included in at least one of the plurality of second sub-matrices.

Preferably, if the parity check matrix H comprises a plurality of second sub-matrices having (n−k)×(n−k)/m dimensions, the second part having the column weight of $w_c+w_a$ configures a portion of each of the plurality of second sub-matrices.

More preferably, the second part having the column weight of $w_c+w_a$ corresponds to a prescribed column of at least one of the plurality the second sub-matrices or entire columns of at least one of the plurality of second sub-matrices.

More preferably, the second part having the column weight of $w_c+w_a$ corresponds to a prescribed column of each of the plurality of second sub-matrices.

More preferably, if the parity check matrix H includes a plurality of first sub-matrices having (n−k)/m×(n−k)/m dimensions, a row weight and column weight of each of the plurality of first sub-matrices in the first part having the column weight $w_c$ has predetermined regularity. More preferably, the row weight and column weight of each of the plurality of first sub-matrices in the first part having the column weight of $w_c$ is 0 or 1.

Preferably, any two random rows of the entire $H_d$ do not have 1 on at least two columns simultaneously. More preferably, a case that all combination-enabling two rows selected from three random rows of the entire $H_d$ have 1 on a same column is equal to or smaller than a preset critical value ($C_{max}$).

Preferably, any two random rows of the entire parity check matrix H do not have 1 on at least two rows simultaneously. More preferably, a case that all combination-enabling two rows selected from three random rows of the parity check matrix H have 1 on a same column is equal to or smaller than a preset critical value ($C_{max}$).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 is an exemplary diagram for explaining a relation of $H=[H_d|H_p]$;

FIG. 3 is an exemplary diagram of a dual diagonal matrix;

BEST MODE FOR CARRYING OUT THE INVENTION

Reference will now be made in detail to a method of encoding and decoding using an LDPC (low density parity check) code according to the preferred embodiments of the present invention, examples of which are illustrated in the accompanying drawings.

Figure 1:
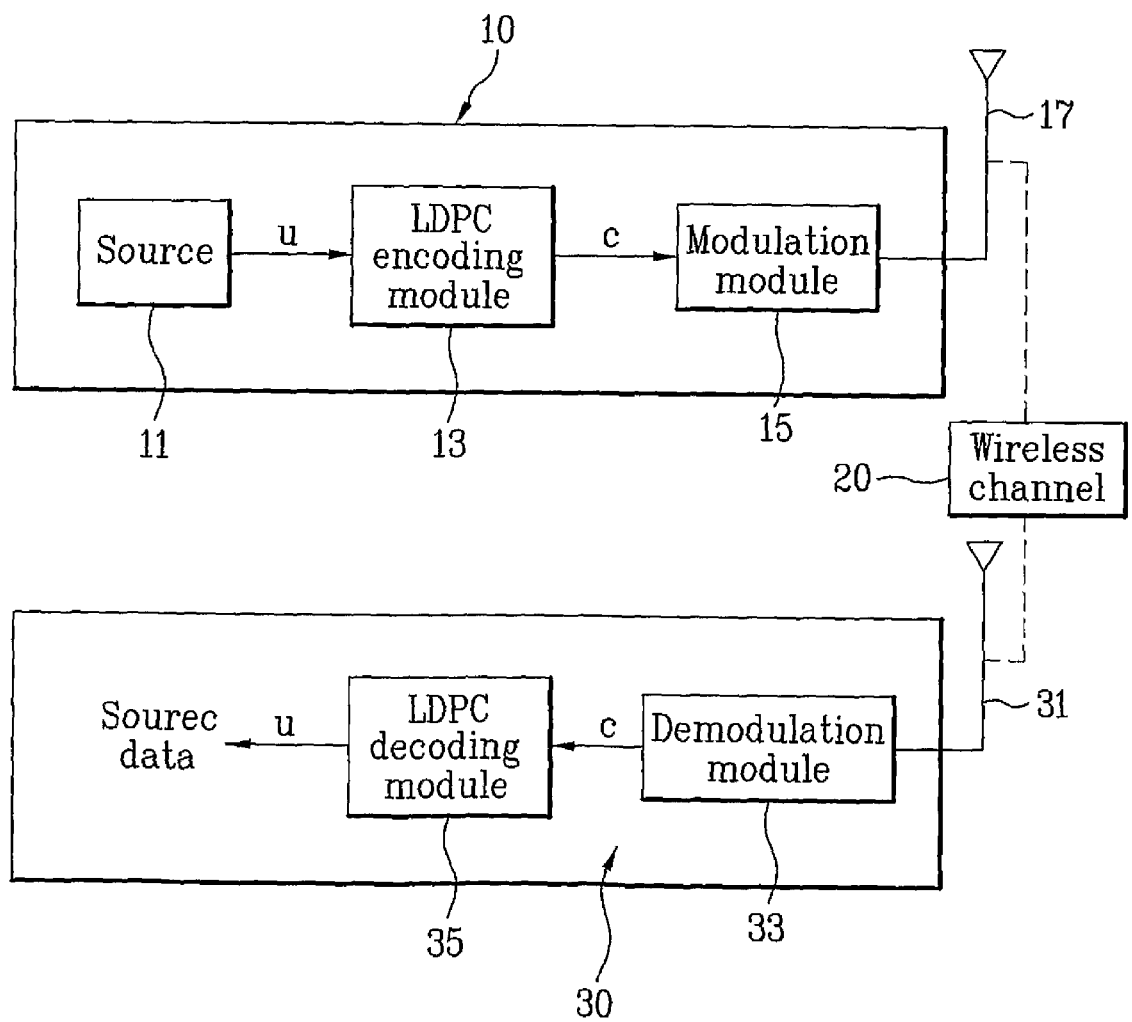
FIG. 1 is a block diagram of a communication system to explain one preferred embodiment of the present invention.

FIG. 1 is a block diagram of a communication system to explain one preferred embodiment of the present invention, in which a technical feature of the present invention is applied to a wireless communication system for example.

Referring to FIG. 1, a transmitter 10 and a receiver 30 communicate with each other using a wireless channel 20 as a medium. In the transmitter 10, a k-bit source data u outputted from a data source 11 is converted to an n-bit codeword c by LDPC encoding in an LDPC encoding module 13. The codeword c is wireless-modulated by a modulation module 15, is transmitted via an antenna 17, and is then received by another antenna 31 of the receiver 30. In the receiver 30, original data is restored through a process reverse to that of the transmitter 10. Namely, the source data u can be finally obtained by demodulation of a demodulation module 33 and decoding of an LDPC decoding module 35.

The above explained data transmitting/receiving process is described within a minimum range required for explaining the features of the present invention. So, it is apparent to those having ordinary skill in the art that the corresponding process needs more procedures for the data transmission/reception.

In Equation 1, a first parity check matrix H can be expressed by $H=[H_d|H_p]$ ($H_d$ is (n−k)×k dimensional, $H_p$ is (n−k)×(n−k) dimensional). FIG. 2 is an exemplary diagram for explaining a relation of $H=[H_d|H_p]$. The 'k' is a length (bit unit) of source data inputted to the LDPC encoding module 13 and the 'n' means a length (bit unit) of the encoded codeword c.

By Equation 1 and the relation of $H=[H_d|H_p]$, it can be known that $G=[I|(H_p^{-1}H_d)^t]^t$. Hence, the LDPC encoding module 13 performs encoding in a manner of multiplying the input data u by '$G=[I|(H_p^{-1}H_d)^t]^t$' by Equation 2. Hence, Equation 2 can be replaced by Equation 4. In particular, a k-bit input source data $s_{1 \times k}$ is encoded into an n-bit codeword $x_{1 \times k}$ by Equation 2. A codeword x has a configuration of $x=[s\ p]=[s_0, s_1, \ldots, s_{k-1}, p_0, p_1, \ldots, p_{m-1}]$, where $(p_0, p_1, \ldots, p_{m-1})$ are parity check bits and $(s_0, s_1, \ldots, s_{k-1})$ are systematic bits.

$$c=[I|(H_p^{-1}H_d)^t]^t \cdot u \qquad \text{[Equation 3]}$$

Yet, the encoding scheme using the generator matrix G is very complicated. To reduce such a complexity, it is preferable that the input source data is directly encoded using the parity check matrix H. Namely, since $x=[s\ p]$, $H \cdot x = H \cdot [s\ p]=0$ if using a characteristic of $H \cdot x=0$. From the Equation, a parity check bit p can be obtained to finally find the code word $x=[s\ p]$.

A dual diagonal matrix of $(n-k) \times (n-k)$ dimensions may preferably used as the $H_p$. The dual diagonal matrix means a matrix in which a main diagonal and a diagonal directly beneath or above the main diagonal are set to '1' and in which the rest points are set to zeros, respectively. And, FIG. 3 shows an exemplary diagram to help the dual diagonal matrix to be understood.

Figure 4:
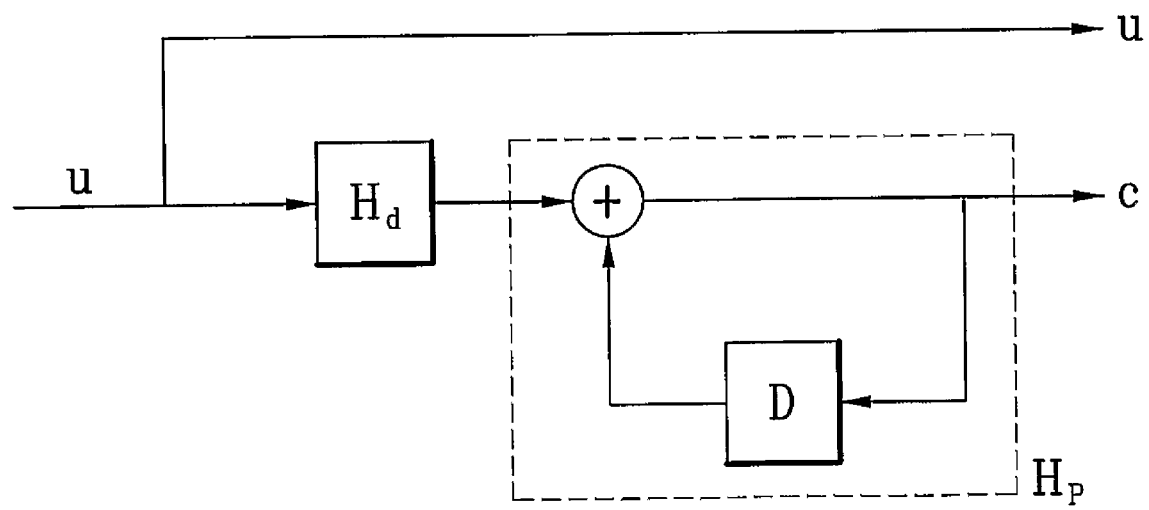
FIG. 4 is a block diagram of an encoder substantially implementing an encoding process using a parity check matrix H.

FIG. 4 is a block diagram of an encoder substantially implementing an encoding process using a parity check matrix H.

Referring to FIG. 4, an input data u is encoded by an $H_d$ part and an $H_p^{-1}$ part into an encoded codeword c. The $H_p^{-1}$ part shown in FIG. 4 is a configurational example of substantially implementing $H_p^{-1}$ in using a dual diagonal matrix as $H_p$.

The features of the present invention lie in the parity check matrix H having the structure of $[H_d|H_p]$ and in the data structure of $H_d$ that configures the parity check matrix H. The feature of $H_d$ according to the present invention is mainly explained in the following description. The feature of $H_d$ according to the present invention explained in the following description can be applied to the entire parity check matrix H in the same manner.

The $H_d$ is characterized in having predetermined regularity in weights of columns and rows. The regularity can be obtained in the following manner. First of all, the $H_d$ is divided into $r/(1-r)$ matrices $H^{(i)}_d$ [where $r=k/n$ and $i=1, 2, \ldots, r/(1-r)$] having $(n-k) \times (n-k)$ dimensions, a random $H^{(i)}_d$ is divided into $m \times m$ sub-matrices having $(n-k)/m \times (n-k)/m$ dimensions, and a row or column weight of the first random sub-matrix configuring the $H_d$ is set to 1. Moreover, the $H_d$ is configured such that any two random rows of the parity check matrix H do not have 1 on at least two points simultaneously. Preferably, a number of 6-cycles configured to include a random '1' included in the parity check matrix H is set smaller than a preset critical value ($C_{max}$).

In particular, the $H_d$ can include at least one $H^{(i)}_d$ [where $i=1, 2, \ldots, r/(1-r)$] according to a code rate ($r=k/n$). The code rate r is a ratio of a source data length k to a length n of the encoded data and $r=1/2, 2/3, 3/4, 4/5$ and the like is used in general. The $H^{(i)}_d$ is a matrix having $(n-k) \times (n-k)$ dimensions and has a relation of $H_d=[H^{(1)}_d|H^{(2)}_d|\ldots|H^{(r/(1-r))}_d]$. In case that each $H^{(i)}_d$ includes $m \times m$ sub-matrices having $(n-k)/m \times (n-k)/m$ dimensions, it is able to give regularity to row or column weights of the entire Hd in a manner that a row or column weight of a random sub-matrix configuring the $H_d$ is set to 1. The 'm' is a positive integer and corresponds to a resolution factor of the $H_d$. Preferably, the 'm' is selected from 4~12 to provide best performance.

Figure 5:
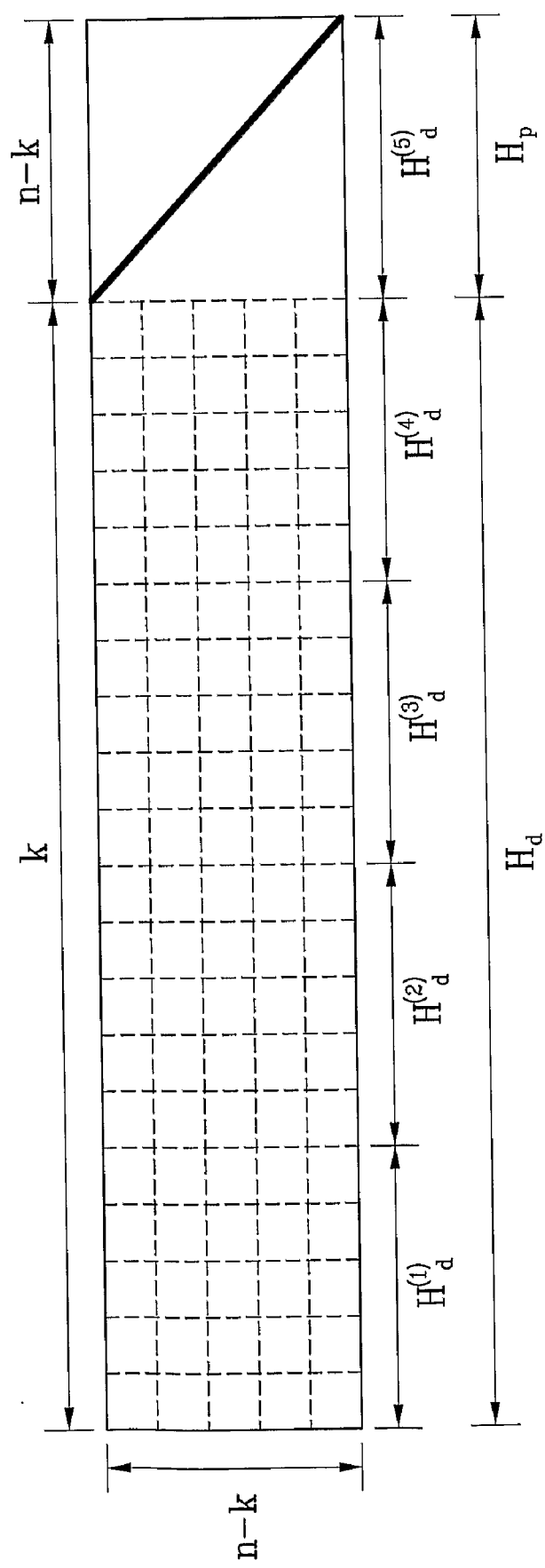
FIG. 5 is a diagram for explaining a structure of a parity check matrix according to the present invention.

FIG. 5 is a diagram for explaining a structure of a parity check matrix according to the present invention.

Referring to FIG. 5, the parity check matrix H has a structure of $[H_d|H_p]$ and the $H_d$ has a structure of $H_d=[H^{(1)}_d|H^{(2)}_d|H^{(3)}_d|H^{(4)}_d]$. In the example of FIG. 5, each $H^{(i)}_d$ includes 25 (5×5) first sub-matrices in case of m=5. A fact that a row or column weight of each of the first sub-matrices is 1 means that '1' exists on a random row or column of each of the first sub-matrices and that the rest values of the random row or column are zeros, respectively. Preferably, the 'm' is selected from 4~12 to provide best performance.

Alternatively, the row or column weight of the first random sub-matrix configuring the $H_d$ could be 0 or 1. Namely, some of the first sub-matrices configuring the $H^{(i)}_d$ may have the row or column weights of 0 or 1, respectively. In this case, it is preferable that the sub-matrices having the row or column weight of 0 for the random $H^{(i)}_d$ exist to have the same number in the direction of the row or column of the $H^{(i)}_d$.

Preferably, a dual diagonal matrix of $(n-k) \times (n-k)$ dimensions is used as the $H_p$. The dual diagonal matrix means a matrix in which a main diagonal and a diagonal directly beneath or above the main diagonal are set to '1' and in which the rest points are set to zeros, respectively.

In the above description, it is explained that the row or column weight configuring the $H_d$ is 0 or 1. Yet, in case that the entire parity check matrix H includes a plurality of first sub-matrices having $(n-k)/m \times (n-k)/m$ dimensions, it will be possible that a row or column weight of a random one of the first sub-matrices is set to 1. Namely, the row or column weight of the first sub-matrix configuring the $H_d$ is 0 or 1 for the $H_d$ configuring the parity check matrix H or the row or column weight of the first sub-matrix configuring the entire parity matrix H is 0 or 1 for the entire parity check matrix H.

According to another preferred embodiment of the present invention, the $H_d$ can include one part having a column weight of $w_c$ and the other part having a column weight of $w_c+w_a$ ($w_c$ or $w_a$ is a constant that is not zero). Namely, a column weight amounting to $w_a$ is additionally added to the $H_d$ in part. The part to which the $w_a$ is not added can continue maintaining the aforesaid regularity. Preferably, most parts of the $H_d$ have the column weight of $w_c$ and the $H_d$ partially has the column weight of $w_c+w_a$ that is greater than $w_c$. Preferably, the $w_a$ can be selected within a range of 10~110% of the $w_c$.

Meanwhile, in case that the $H_d$ is divided into a plurality of second sub-matrices having $(n-k) \times (n-k)/m$ dimension, the part having the column weight of $w_c+w_a$ can be included in at least one of a plurality of the second sub-matrices or may configure each of a plurality of the second sub-matrices in part.

Figure 6:
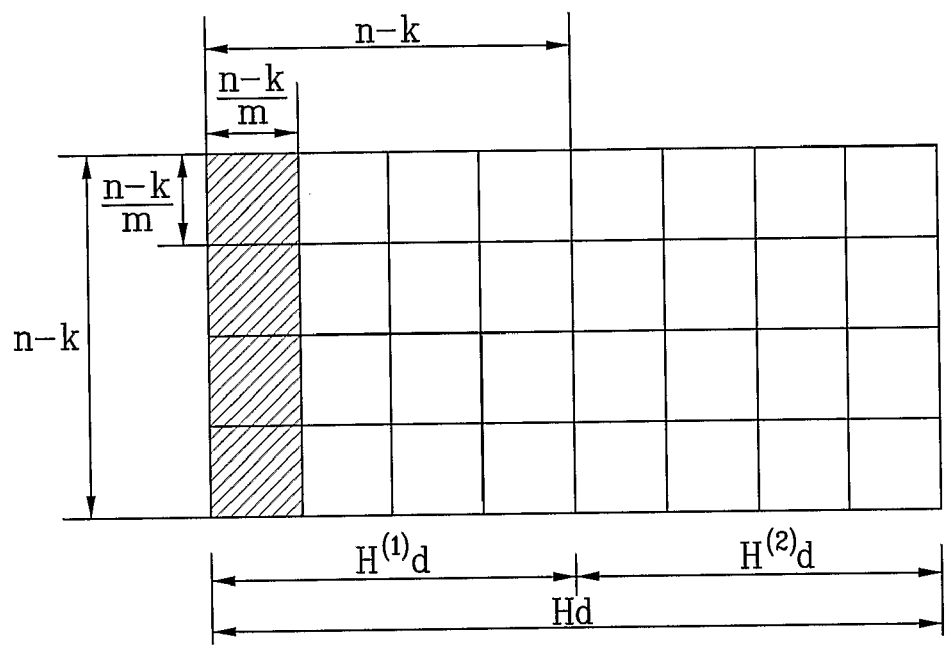
FIG. 6 is a diagram for explaining a case that a part having a column weight of $w_c+w_a$ is included in one second sub-matrix among a plurality of second sub-matrices according to one preferred embodiment of the present invention.

FIG. 6 is a diagram for explaining a case that a part having a column weight of $w_c+w_a$ is included in one second sub-matrix among a plurality of second sub-matrices according to one preferred embodiment of the present invention.

Referring to FIG. 6, $H_d$ includes eight second sub-matrices having $(n-k) \times (n-k)/m$ dimensions, and each of the second sub-matrices includes four first sub-matrices having $(n-k)/m \times (n-k)/m$ dimensions. As mentioned in the foregoing description, since column weights of the first sub-matrices are equal to each other as 1, the column weight of the second sub-matrices are equal to each other as $w_c=4$. Yet, by adding $w_a$ to a column weight of a first second sub-matrix indicated by a shaded portion, the corresponding column weight of the first second sub-matrix is greater than that of another second sub-matrix. In FIG. 6, the first second sub-matrix is made heavier than another second sub-matrix in the column weight.

Yet, it is also possible to add $w_a$ to another second sub-matrix as well as to the first second sub-matrix. Moreover, it is possible to add $w_a$ to a portion of one second sub-matrix as well as to entire portions of the corresponding second sub-matrix.

Furthermore, the part having the column weight of $w_c+w_a$ can be included in at least two of a plurality of the second sub-matrices. For instance, it is able to add a column weight of $w_a$ to entire portions of the first second sub-matrix and a portion of a second second sub-matrix simultaneously.

The decoding method using the LDPC code is carried out in a manner of repetitive exchange of probability information decided according to a channel status between rows configuring the parity check matrix H. if the column weight of a portion of the parity check matrix H is made heavier that another portion, a convergence speed in the decoding process is accelerated to enhance decoding performance.

Figure 7:
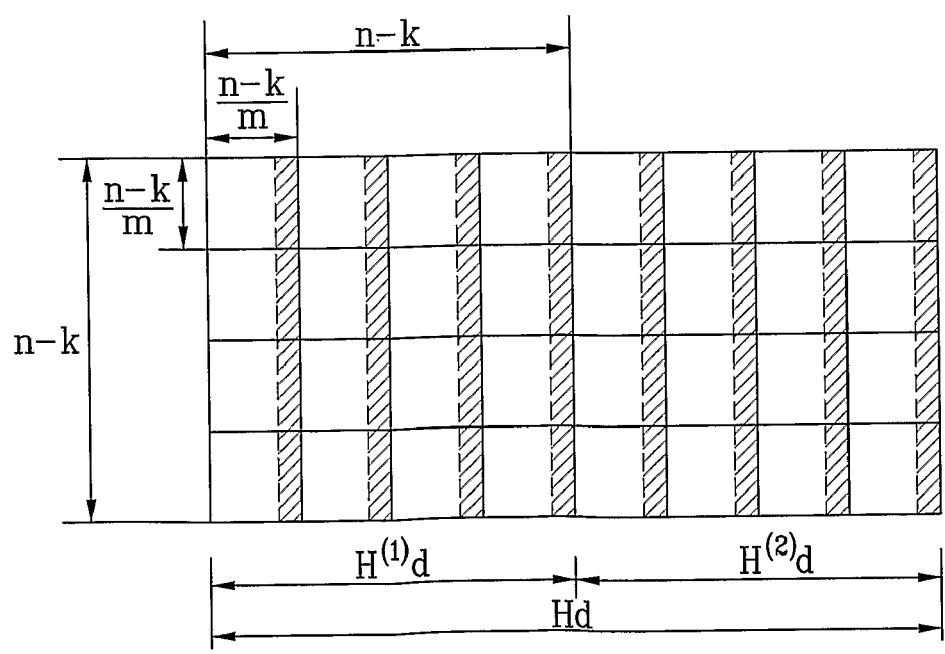
FIG. 7 is a diagram for explaining a case that a part having a column weight of $w_c+w_a$ is included in each of a plurality of second sub-matrices according to one preferred embodiment of the present invention.

FIG. 7 is a diagram for explaining a case that a part having a column weight of $w_c+w_a$ is included in each of a plurality of second sub-matrices according to one preferred embodiment of the present invention.

Referring to FIG. 7, $w_a$ is added to a portion (shaded portion) of each of a plurality of second sub-matrices to have a column weight heavier than another portion of each of a plurality of the second sub-matrices. In this case, it is preferable that the added column weight is made equal to $w_c$ so that the portion having the $w_a$ added thereto is twice heavier than the other portion to which the $w_a$ is not added. Configured like FIG. 7, the $H_d$ facilitates its application to a system employing a variable data rate.

Preferably, a number of 6-cycles, each of which includes a random 1 included in the parity check matrix H configured with the $H_d$ having the above features, is equal to or smaller than a preset critical value ($C_{max}$) and any two random rows of the parity check matrix H does not have 1 on two columns simultaneously. Even if the 6-cycle exists in the parity check matrix H, it is preferable that the critical value $C_{max}$ is determined within a range that can avoid performance degradation of the encoding and decoding using the parity check matrix H. More preferably, the critical value $C_{max}$ is determined within a reasonable range by measuring and comparing the performance enhancement effect due to the reduction of the 6-cycle existing in the parity check matrix H and the calculation loads necessary for reducing the 6-cycle together. As a result of simulation, satisfactory performance can be obtained within a range of the critical value $C_{max}$ between 10~500. And, better performance is expected with a range of 10~100. Yet, the critical value $C_{max}$ is not limited to the above range.

Figure 8:
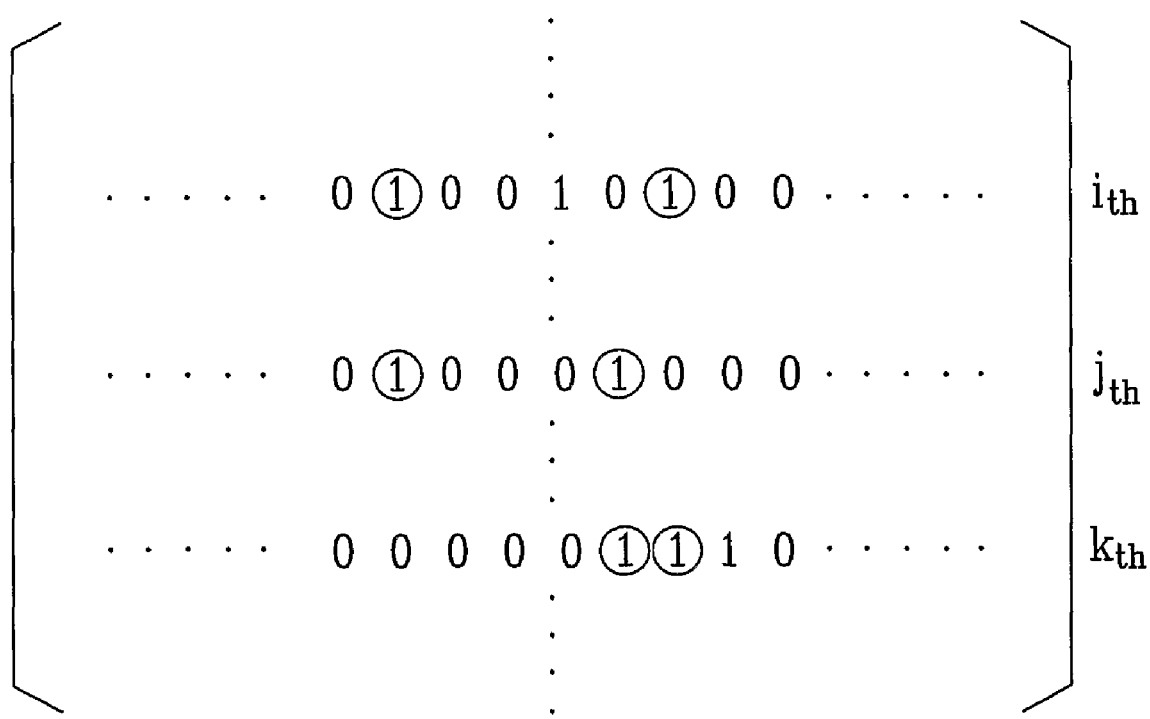
FIG. 8 is an exemplary diagram for explaining a case that all combination-enabling two rows selected from three random rows of a parity check matrix H have '1' at the same points, respectively.
Figure 9:
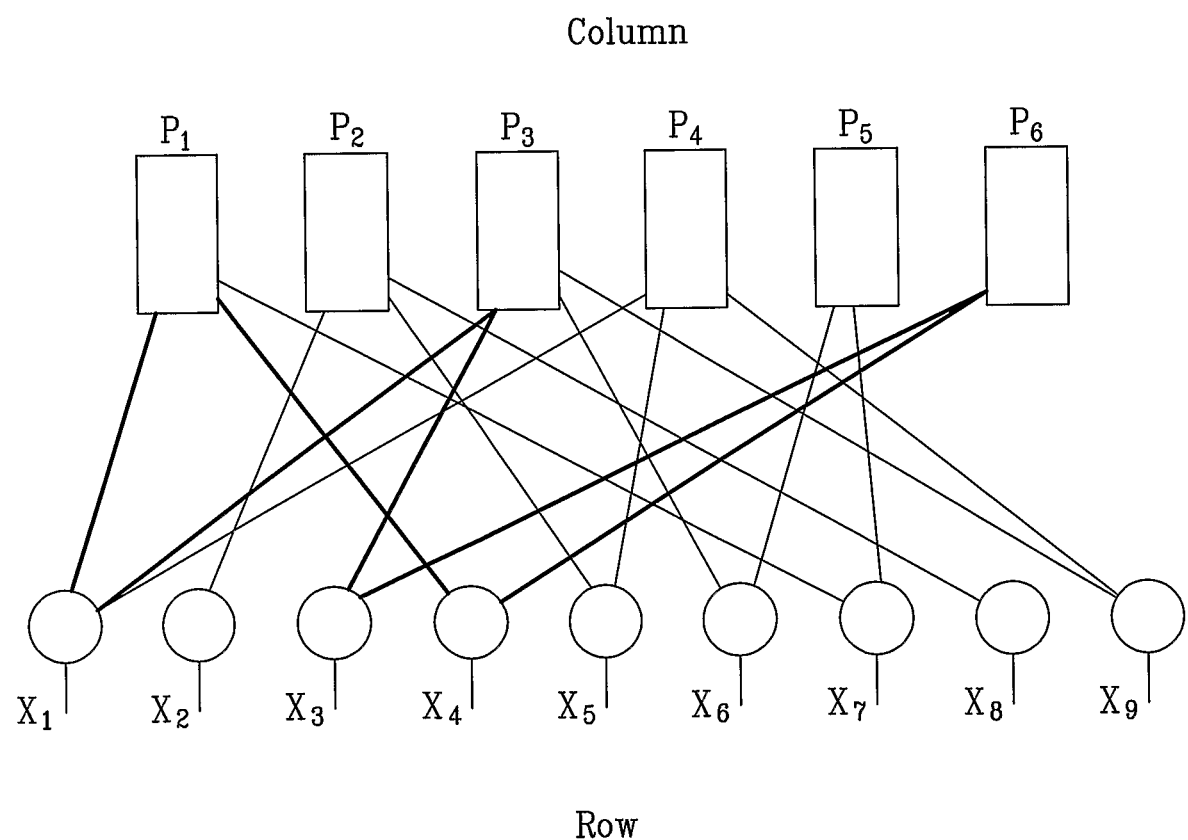
FIG. 9 is a bipartite graph as a different expression of a parity check matrix H.

FIG. 8 shows an exemplary case that all combination-enabling two rows selected from three random rows of the parity check matrix H have '1' at the same points, respectively. In other words, all combination-enabling two rows selected from $i^{th}$, $j^{th}$ and $k^{th}$ rows, i.e., $i^{th}$ and $j^{th}$ rows, $j^{th}$ and $k^{th}$ rows, or $k^{th}$ and $i^{th}$ rows have '1' at the same points. In FIG. 8, if close-circled six points of are connected, a cycle is formed. And, this cycle is called a 6-cycle. FIG. 9 is a bipartite graph as a different expression of a parity check matrix H, which means a 6-row 9-column parity check matrix. Parts indicated by bold lines in FIG. 9 configure the 6-cycle. Hence, a case that the number of the 6-cycles, each of which is configured to include the random 1 included in the parity check matrix H, is equal to or smaller than the preset critical value ($C_{max}$) means that the 6-cycle including the random 1 by taking the random 1 included in the parity check matrix H as a reference is equal to or smaller than the critical value ($C_{max}$).

Figure 10:
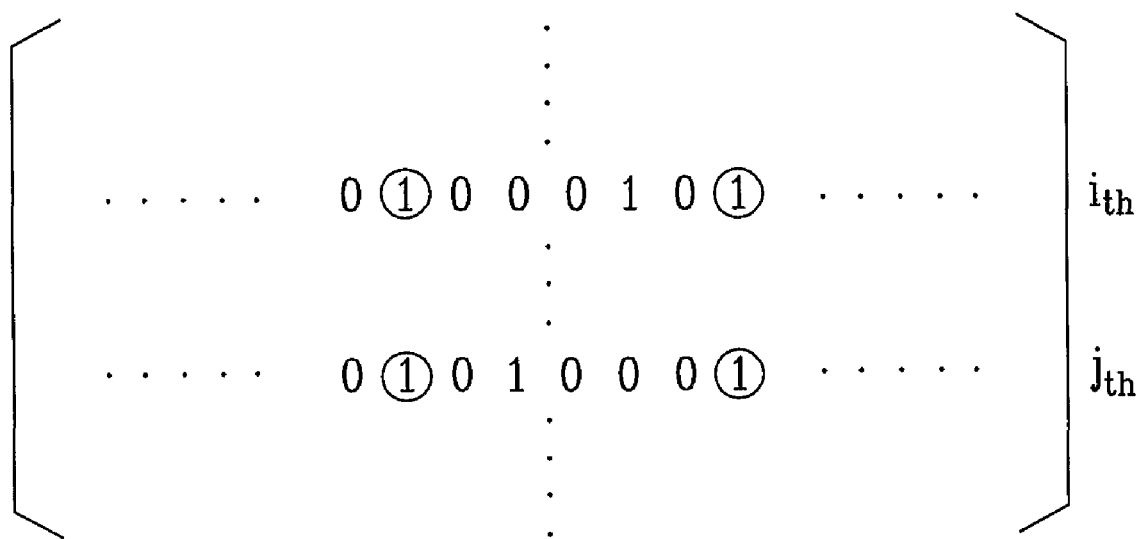
FIG. 10 is an exemplary diagram of a case that two rows of a parity check matrix H simultaneously have '1' at two points, respectively.

FIG. 10 shows an exemplary case that two rows of the parity check matrix H have '1' at Two Columns simultaneously.

Referring to FIG. 10, two points indicated by two closed circles of an $i^{th}$ row and two points indicated by two closed circles of a $j^{th}$ row are set to '1'. The parity check matrix H should avoid the case shown in FIG. 10 to enable the encoding or decoding method using the LDPC code to provide good performance. A case that two points of two rows of the parity check matrix H have '1' simultaneously is called a 4-cycle. Hence, the fact that any two random rows of the parity check matrix H do not simultaneously have '1' on at least two points means that the 4-cycle is not formed through the parity check matrix H overall.

As mentioned in the foregoing description, the encoding method using the LDPC code is carried out in a manner of repetitive exchange of probability information decided according to a channel status between rows configuring the parity check matrix H. In the parity check matrix H failing to meet two conditions about the 4- and 6-cycle, since the probability information of each row is once transferred to another rows and then returns without sufficient repetitions, good performance is not expected.

In case of using the parity check matrix H having the technical features of the present invention in encoding and decoding, by reducing or adding the first sub-matrix if a code rate is varied according to a channel status and the like, a characteristic of the parity check matrix H is sustained despite varying a size of parity check matrix H. Hence, the parity check matrix H facilitates to be adapted to a system employing a variable code rate.

Figure 11:
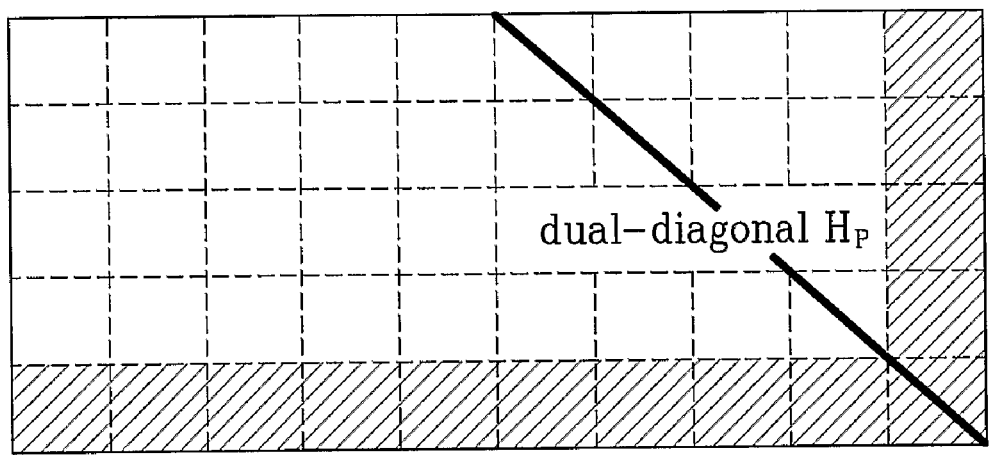
FIG. 11 and FIG. 12 are diagrams for explaining a structure of reducing a parity bit in one preferred embodiment of the present invention.

In case of reducing parity bits, as shown in FIG. 11, first random sub-matrices are reduced from first sub-matrices configuring the $H_p$ in a column direction by a first sub-matrix unit and first random sub-matrices are reduced from first sub-matrices configuring the $H_d$ and $H_p$ in a row direction by the first sub-matrix unit. A shaded portion in FIG. 11 is the portion that is reduced.

Figure 12:
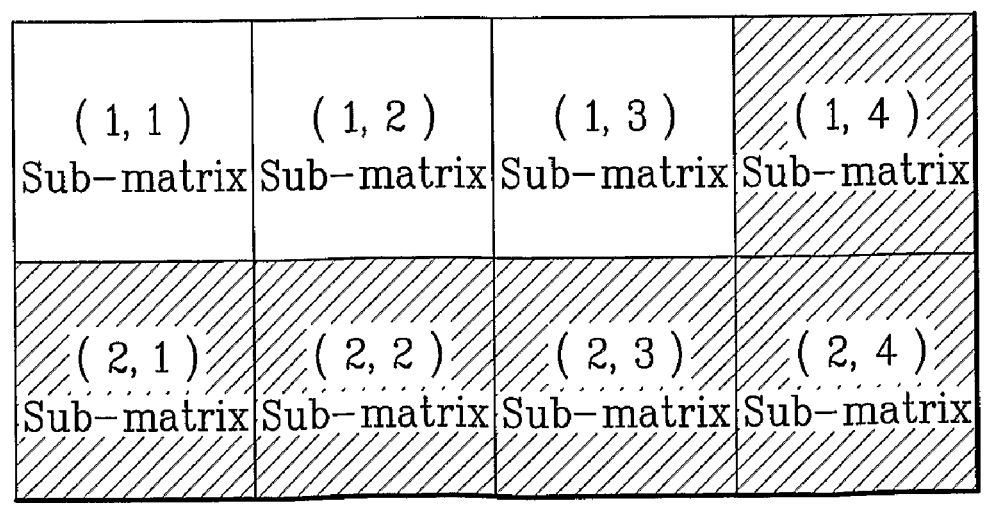

FIG. 12 is a diagram for explaining an example of configuring the parity check matrix H with first sub-matrices (1, 1), (1, 2) and (1, 3) only by eliminating sub-matrices (1, 4), (2, 1), (2, 2), (2, 3) and (2, 4) to reduce parity bits for the parity check matrix H basically configured with eight first sub-matrices.

Referring to FIG. 12, first sub-matrices (1, 1) and (1, 2) configure $H_d$ and a sub-matrix (1, 3) configures $H_p$, whereby a code rate r=2/3. In FIG. 11, by eliminating the first sub-matrices (1, 3), (2, 1), (2, 2), (2, 3) and (2, 4), it is also able to reduce parity bits. Since each row weight or column weight of the first sub-matrices configuring the $H_d$ is 0 or 1, it is able for the $H_d$ to maintain the basic feature that a weight of random row and column of the remaining matrix after eliminating several first sub-matrices is 0 or 1.

TABLE 1

| Code rate (R) | $N_{cw}$ (bits) | $N_{info}$ (bits) | $N_{parity}$ (bits) |
| --- | --- | --- | --- |
| R = 4/5 | 1440 | 1152 | 288 |
| R = 3/4 | 1536 | 1152 | 384 |
| R = 2/3 | 1728 | 1152 | 576 |
| R = 1/2 | 2304 | 1152 | 1152 |
| R = 1/3 | 3456 | 1152 | 2304 |

Table 1 shows an example of varying a code rate R by changing parity bits $N_{parity}$. Namely, if some of the first sub-matrices of the parity check matrix H, as shown in FIG. 11 and FIG. 12, are eliminated, it is able to reduce parity bits $N_{parity}$ to raise the code rate R consequently.

Figures 13, 14:
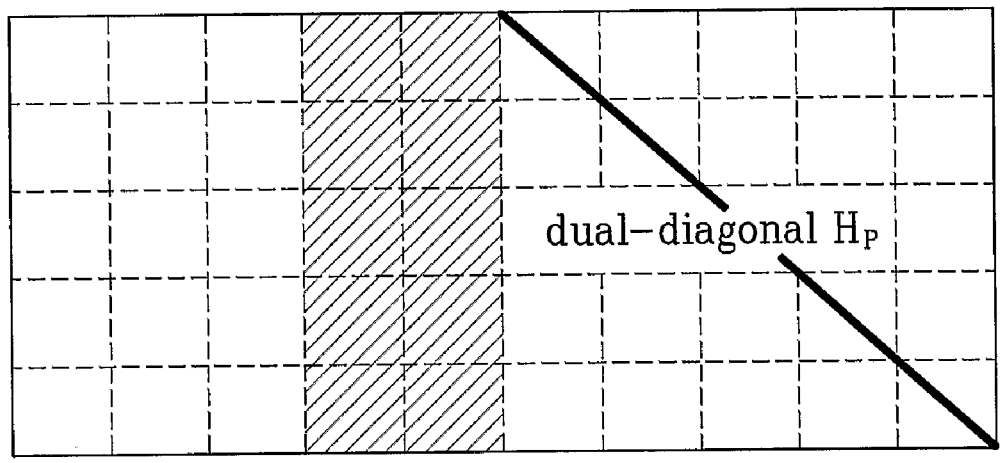
FIG. 13 and FIG. 14 are diagrams for explaining a case of reducing a systematic bit in one preferred embodiment of the present invention.

In case of reducing systematic bits, the first sub-matrices, as shown in FIG. 13, are randomly eliminated in a column direction from the entire first sub-matrices configuring the $H_d$ by a first sub-matrix unit. A shaded portion in FIG. 13 is to be eliminated.

FIG. 14 is a diagram for explaining a case of eliminating first sub-matrices (1, 1) and (2, 1) to reduce systematic bits for the parity check matrix H basically configured with eight first sub-matrices.

Referring to FIG. 14, systematic bits can be reduced by eliminating first sub-matrices (1, 2) and (2, 2) instead of eliminating first sub-matrices (1, 1) and (2, 1).

TABLE 2

| Code rate (R) | $N_{cw}$ (bits) | $N_{info}$ (bits) | $N_{parity}$ (bits) |
|---|---|---|---|
| R = 4/5 | 1920 | 1536 | 384 |
| R = 3/4 | 1536 | 1152 | 384 |
| R = 2/3 | 1152 | 768 | 384 |
| R = 1/2 | 768 | 384 | 384 |
| R = 1/3 | 576 | 192 | 384 |

Table 2 shows an example of varying a code rate R by changing systematic bits $N_{info}$. Namely, if some of the first sub-matrices of the parity check matrix H, as shown in FIG. 13 and FIG. 14, are eliminated, it is able to increase systematic bits $N_{info}$ to raise the code rate R consequently.

Figure 15:
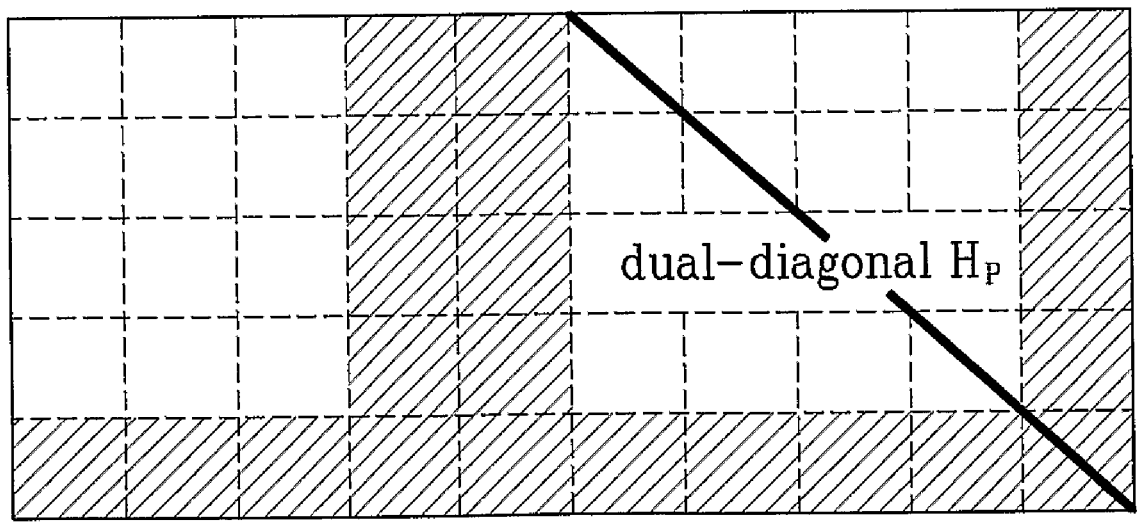
FIG. 15 is a diagram for explaining a case of reducing parity and systematic bits in one preferred embodiment of the present invention.

In case of reducing both parity bits and systematic bits simultaneously, the first sub-matrices, as shown in FIG. 15, are randomly eliminated in column and row directions from the entire first sub-matrices configuring the $H_p$ and $H_d$ by a first sub-matrix unit. A shaded portion in FIG. 15 is to be eliminated.

Figure 16A:
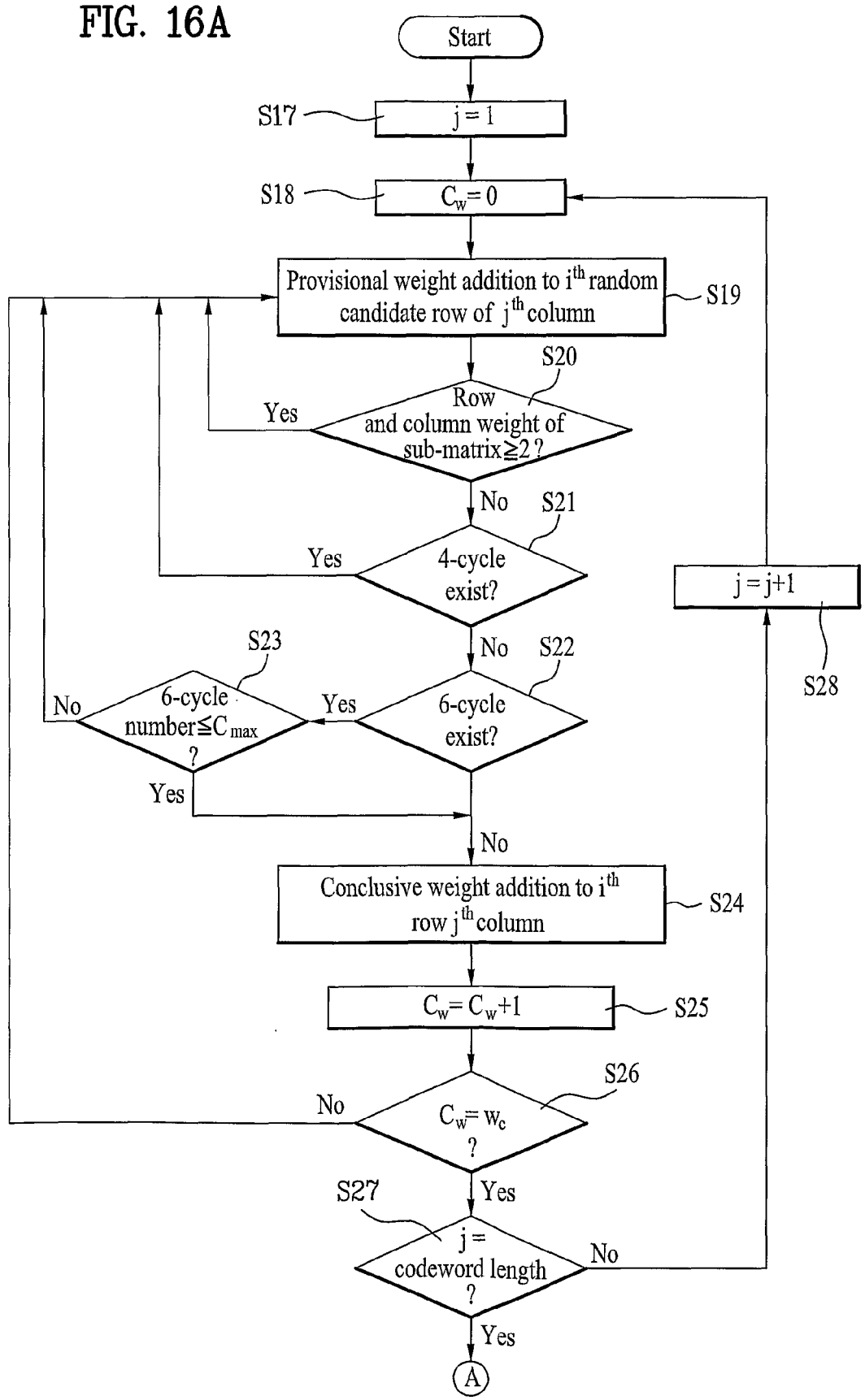
FIG. 16A and FIG. 16B are flowcharts of processes for generating a parity check matrix H according to the present invention.
Figure 16B:
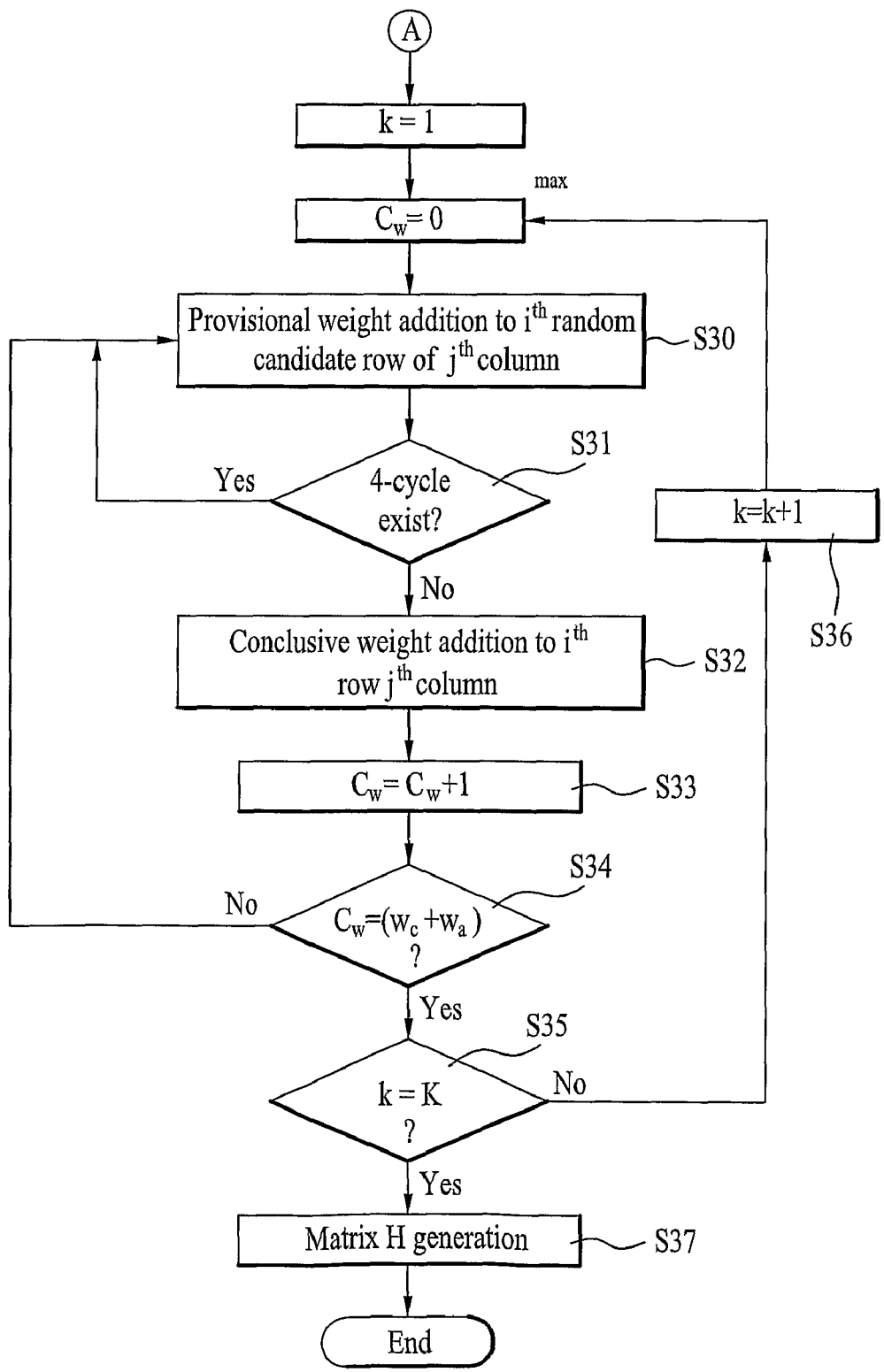

FIG. 16A and FIG. 16B are flowcharts of processes for generating a parity check matrix H according to the present invention. The methods explained in the following are just exemplary and the parity check matrix H having the aforesaid features can be generated in various ways.

Referring to FIG. 16A and FIG. 16B, 'i' is an index of an arbitrary row of the parity check matrix H, 'j' is an index of an arbitrary column of the parity check matrix X, 'k' is an index of a column to which $w_a$ is added, and $C_w$ indicates a current weight number of the arbitrary column j or k.

First of all, a weight starts being added to a first column (j=1) having no weight ($C_w$=0) (S17, S18). In this case, the weight addition means that an element corresponding to an arbitrary row of an arbitrary column is set to '1'.

A weight is provisionally added to an arbitrary $i^{th}$ candidate row of the first column (S19). The provisional weight addition means that the weight addition to the corresponding row is not final but can be changed by a next procedure. Subsequently, if the parity check matrix H is configured with a plurality of first sub-matrices having (n−k)/m×(n−k)/m dimensions, it is checked whether a row or column having a weight equal to or greater than 2 exists in rows or columns of the sub-matrix to which an $i^{th}$ row of a $j^{th}$ column belongs (S20). If the row or column having the weight equal to or greater than 2 exists in the rows or columns of the sub-matrix to which the $i^{th}$ row of the $j^{th}$ column belongs, a weight is added not to the $i^{th}$ row but to a different row (S19) and a next procedure is executed. If the row or column having the weight equal to or greater than 2 does not exist in the rows or columns of the sub-matrix to which the $i^{th}$ row of the $j^{th}$ column belongs, it is decided whether a 4-cycle exists in the entire parity check matrix H (S21).

The 4-cycle means a case that two random rows of the parity check matrix H simultaneously have '1' at two points, respectively. Namely, 'there is no case of configuring the 4-cycle in the entire parity check matrix H' means that any two random rows of the parity check matrix H do not simultaneously have '1' at two points, respectively.

If the 4-cycle exists according to the decision of whether the 4-cycle exists in the entire parity check matrix H (S21), a weight is added not to the $i^{th}$ row but to another row (S19) and a next procedure is then executed. If the 4-cycle does not exist, it is decided whether a 6-cycle configured to include '1' of the $i^{th}$ row exists in the entire parity check matrix H (S22).

As a result of deciding whether the 6-cycle configured to include '1' of the $i^{th}$ row exists in the entire parity check matrix H, if the 6-cycle does not exist, a weight is finally added to the $i^{th}$ row. If the 6-cycle exists, it is decided whether a number of 6-cycles, each of which is configured to include '1' of the $i^{th}$ row, exceeds a preset critical value $C_{max}$ (S23). If the 6-cycle number does not exceed the preset critical value $C_{max}$, a weight is finally added to the $i^{th}$ row (S24). If the 6-cycle number exceeds the preset critical value $C_{max}$, a weight is added not to the $i^{th}$ row but to another row (S19) and a next procedure is then executed.

Once the weight is finally added to the $i^{th}$ row (S24), a current weight number $C_w$ of the $j^{th}$ column is incremented by 1 (S25). It is then decided whether the current weight number of the $j^{th}$ column is equal to $w_c$ (S28). If the current weight number of the $j^{th}$ column is equal to $w_c$, weight addition to the $j^{th}$ column is terminated. And it is decided whether the j is equal to a codeword length (S27). If the current weight number of the $j^{th}$ column is not equal to $w_c$, it goes back to the step S19 to provisionally add a weight to a different row of the $j^{th}$ column and to continue executing the corresponding subsequent steps.

If the j is equal to the codeword length, a procedure of adding a column weight $w_a$ is initiated. A weight is provisionally added to a first random candidate row of the first column to which the $w_a$ shall be added (s30). And, it is decided whether a 4-cycle exists in the entire parity check matrix H (S31).

As a result of deciding whether the 4-cycle exists in the entire parity check matrix H, if the 4-cycle exists, a weight is added not to the $i^{th}$ row but to another row (S30) and a next procedure is then executed. If the 4-cycle does not exist, a weight is finally added to the $i^{th}$ row (S32). Once the weight is finally added to the $i^{th}$ row (S32), a current weight number $C_w$ of the $k^{th}$ column is incremented by 1 (S33). And, it is decided whether a current weight number of the $k^{th}$ column is equal to ($w_c+w_a$) (S34). If current weight number of the $k^{th}$ column is equal to ($w_c+w_a$), weight addition to the $k^{th}$ column is terminated. And, it is decided whether the k is equal to a final number K of columns to which the column weight k shall be additionally added (S35). If the current weight number of the $k^{th}$ column is not equal to ($w_c+w_a$), it goes back to the step S30. A weight is provisionally added to a different row of the $k^{th}$ column and a next procedure then continues to be executed.

If the k is equal to the final number K of columns to which the column weight k shall be additionally added, it means that the weight addition to the entire parity check matrix H is terminated. Hence, the parity check matrix H can be finally generated according to the weight addition result so far (S37).

If the k is not equal to the final number K of columns to which the column weight k shall be additionally added, it means that there still exists a column to which the weight $w_a$ is not added yet. Hence, 1 is added to the k (S36) to add a weight to a next column from the step S30 in the above-explained manner.

In order for the part having the column weight of $w_c+w_a$ to be included in each of a plurality of the second sub-matrices in part, the k can be incremented by 1 in the step S36 or by (n−k)/m corresponding to the number of columns of the second sub-matrix. Namely, in this case, the K becomes a total of the number of the columns corresponding to the part having the column weight of $w_c+w_a$ included in each of the second sub-matrices.

To generate the parity check matrix H including the sub-matrix having the row or column weight of 0, the row and column weights of several sub-matrices are set to 0 in the parity check matrix H generated by the procedures shown in FIG. 16A and FIG. 16B.

As mentioned in the foregoing description, the entire parity check matrix H can be generated in the above-explained manner. Alternatively, in the parity check matrix H having the configuration of $[H_d|H_p]$, the $H_d$ is generated according to the above-explained steps and $H_p$ having a fixed form can be used. Preferably, a dual diagonal matrix of (n−k)×(n−k) dimensions is used as the $H_p$.

In FIG. 1, the receiver 30 receives to decode the data encoded in the above manner using Equation 4.

$$H \cdot c = 0 \quad \text{[Equation 4]}$$

Namely, if '0' is generated from multiplying an encoded data c by the parity check matrix H, it means that transmission error does not exist. If '0' is not generated from multiplying an encoded data c by the parity check matrix H, it means that transmission error exists. Hence, source data can be correspondingly separated.

It should be understood that the technical spirit and scope of the present invention is extendible to such a recording medium readable by a CPU (control process unit) as a CD-ROM, floppy disc, computer memory, a mobile communication terminal memory and the like. In this case, the data structure of the H or $H_d$ having the features and a program for producing the H or $H_d$ having the features are recorded in the recording medium.

According to the recording medium readable by the computer for the encoding and decoding method using the LDPC code, performance of the encoding and decoding method using the LDPC code can be enhanced and the encoding and decoding method of the present invention is facilitated to be adapted to a communication system using a variable data rate.

INDUSTRIAL APPLICABILITY

Accordingly, the method of encoding and decoding using the LDPC code of the present invention is applicable to such a communication system as a mobile communication system, a portable Internet system, etc.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. A method of encoding input data using low density parity check (LDPC) code, the method comprising:
    encoding first input data using a first parity check matrix to output a first codeword that has a first code rate, the first parity check matrix comprising a plurality of sub-matrices and corresponding to the first code rate;
    eliminating at least one row or column of sub-matrixes of the first parity check matrix to generate a second parity check matrix that corresponds to a second code rate; and
    encoding second input data using the generated second parity check matrix to output a second codeword which has the second code rate,
    wherein a row weight and a column weight of each of the plurality of sub-matrices are 0 or 1, and
    wherein the first code rate is different from the second code rate.

2. The method of claim 1, wherein any two random rows of the first parity check matrix do not have 1 on at least two rows simultaneously.

3. The method of claim 2, wherein a number of cases that all combination-enabling two rows selected from three random rows of the first parity check matrix have 1 on a same column is equal to or smaller than a preset critical value.

4. The method of claim 1, wherein the first parity check matrix has a configuration of $H=[H_d|H_p]$ and the $H_p$ has a main diagonal comprising non-zero sub-matrices.

5. An apparatus for encoding input data using low density parity check (LDPC) code, the apparatus comprising:
    means for encoding first input data using a first parity check matrix to output a first codeword that has a first code rate, the first parity check matrix comprising a plurality of sub-matrices and corresponding to the first code rate;
    means for eliminating at least one row or column of sub-matrixes of the first parity check matrix to generate a second parity check matrix that corresponds to a second code rate; and
    means for encoding second input data using the generated second parity check matrix to output a second codeword which has the second code rate,
    wherein a row weight and a column weight of each of the plurality of sub-matrices are 0 or 1, and
    wherein the first code rate is different from the second code rate.

6. The apparatus of claim 5, wherein the first parity check matrix H has a configuration of $H=[H_d|H_p]$ and the $H_p$ has a main diagonal comprising non-zero sub-matrices.

7. The apparatus of claim 5, wherein any two random rows of the first parity check matrix do not have 1 on at least two rows simultaneously.

8. The apparatus of claim 7, wherein a number of cases that all combination-enabling two rows selected from three random rows of the first parity check matrix have 1 on a same column is equal to or smaller than a preset critical value.

* * * * *